(12) United States Patent
Feil

(10) Patent No.: US 10,957,771 B2
(45) Date of Patent: *Mar. 23, 2021

(54) TRANSISTOR DEVICE WITH A FIELD ELECTRODE THAT INCLUDES TWO LAYERS

(71) Applicant: Infineon Technologies Austria AG, Villach (AT)

(72) Inventor: Thomas Feil, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 15/930,059

(22) Filed: May 12, 2020

(65) Prior Publication Data
US 2020/0273956 A1    Aug. 27, 2020

Related U.S. Application Data

(63) Continuation of application No. 16/270,806, filed on Feb. 8, 2019, now Pat. No. 10,720,500, which is a
(Continued)

(30) Foreign Application Priority Data

Aug. 1, 2016   (DE) .......................... 102016114229.8

(51) Int. Cl.
*H01L 21/336*    (2006.01)
*H01L 29/66*     (2006.01)
(Continued)

(52) U.S. Cl.
CPC .......... *H01L 29/407* (2013.01); *H01L 21/283* (2013.01); *H01L 29/404* (2013.01);
(Continued)

(58) Field of Classification Search
CPC ........................... H01L 29/405; H01L 29/407
(Continued)

(56) References Cited

U.S. PATENT DOCUMENTS 5,216,275 A    6/1993    Chen
6,462,377 B2   10/2002   Hurkx et al.
(Continued)

FOREIGN PATENT DOCUMENTS

DE    102015112434 A1    2/2016
EP        1755168 A2     2/2007
(Continued)

*Primary Examiner* — Calvin Lee
(74) *Attorney, Agent, or Firm* — Murphy, Bilak & Homiller, PLLC

(57) ABSTRACT

Disclosed is a transistor device which includes a semiconductor body having a first surface, a source region, a drift region, a body region being arranged between the source region and the drift region, a gate electrode adjacent the body region and dielectrically insulated from the body region by a gate dielectric, and a field electrode adjacent the drift region and dielectrically insulated from the drift region by a field electrode dielectric. The field electrode includes a first layer and a second layer. The second layer includes a different conductive material as the first layer. A portion of the second layer is disposed above and directly contacts a portion of the first layer.

20 Claims, 7 Drawing Sheets

Related U.S. Application Data continuation of application No. 15/663,903, filed on Jul. 31, 2017, now Pat. No. 10,243,051.

(51) Int. Cl.

| | | |
|---|---|---|
| *H01L 29/40* | (2006.01) |
| *H01L 29/78* | (2006.01) |
| *H01L 29/739* | (2006.01) |
| *H01L 21/283* | (2006.01) |
| *H01L 29/43* | (2006.01) |
| *H01L 29/423* | (2006.01) |

(52) U.S. Cl.
CPC ........ *H01L 29/405* (2013.01); *H01L 29/4236* (2013.01); *H01L 29/435* (2013.01); *H01L 29/66734* (2013.01); *H01L 29/7397* (2013.01); *H01L 29/7813* (2013.01)

(58) Field of Classification Search
USPC ......... 257/282, 329, 488; 438/156, 173, 272
See application file for complete search history.

(56) References Cited

U.S. PATENT DOCUMENTS

| | | | |
|---|---|---|---|
| 7,504,690 B2 | 3/2009 | Kelly et al. | |
| 7,851,349 B2 | 12/2010 | Rieger et al. | |
| 8,362,550 B2 * | 1/2013 | Rexer | H01L 29/7811 257/330 |
| 9,006,822 B2 | 4/2015 | Peake et al. | |
| 10,243,051 B2 * | 3/2019 | Feil | H01L 29/404 438/272 |
| 10,720,500 B2 * | 7/2020 | Feil | H01L 29/404 29/407 |
| 2007/0013000 A1 | 1/2007 | Shiraishi | |
| 2007/0093019 A1 | 4/2007 | Rieger et al. | |
| 2007/0108511 A1 | 5/2007 | Hirler | |
| 2007/0114599 A1 | 5/2007 | Hshieh | |
| 2007/0170549 A1 | 7/2007 | Tsuzuki et al. | |
| 2008/0135929 A1 | 6/2008 | Saito et al. | |
| 2009/0057757 A1 | 3/2009 | Hokomoto et al. | |
| 2009/0079002 A1 | 3/2009 | Lee et al. | |
| 2009/0189218 A1 | 7/2009 | Pan | |
| 2009/0256197 A1 | 10/2009 | Nakazawa et al. | |
| 2010/0078707 A1 | 4/2010 | Haeberlen et al. | |
| 2011/0059586 A1 | 3/2011 | Akiyama et al. | |
| 2011/0136309 A1 | 6/2011 | Grivna et al. | |
| 2011/0169081 A1 | 7/2011 | Ishikawa et al. | |
| 2011/0254088 A1 | 10/2011 | Darwish et al. | |
| 2012/0313161 A1 | 12/2012 | Grivna et al. | |
| 2012/0319199 A1 | 12/2012 | Zeng et al. | |
| 2013/0153995 A1 | 6/2013 | Misawa et al. | |
| 2013/0161742 A1 | 6/2013 | Cho et al. | |
| 2014/0077290 A1 | 3/2014 | Hsieh | |
| 2014/0206162 A1 | 7/2014 | Eguchi et al. | |
| 2015/0053999 A1 | 2/2015 | Kumagai | |
| 2015/0076600 A1 | 3/2015 | Jun et al. | |
| 2016/0079376 A1 | 3/2016 | Hirler et al. | |
| 2017/0179225 A1 | 6/2017 | Lee et al. | |
| 2018/0012956 A1 | 1/2018 | Ohashi et al. | |
| 2018/0083128 A1 | 3/2018 | Yokoyama et al. | |
| 2019/0081147 A1 | 3/2019 | West et al. | |

FOREIGN PATENT DOCUMENTS

| | | |
|---|---|---|
| KR | 20050006283 A | 1/2005 |
| KR | 20160026772 A | 3/2016 |
| KR | 20160073143 A | 6/2016 |
| WO | 2009079465 A1 | 6/2009 |
| WO | 2010132283 A1 | 11/2010 |

* cited by examiner

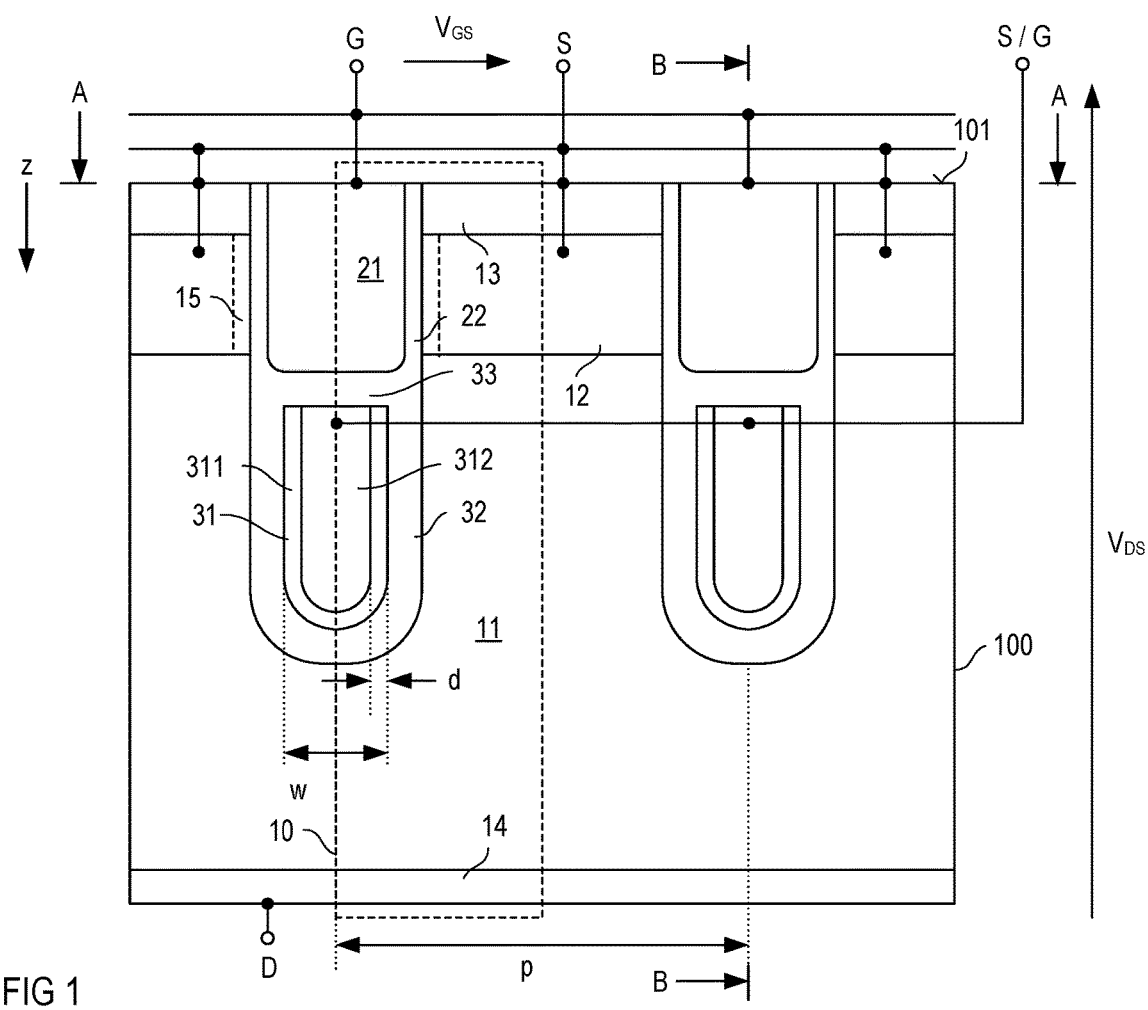
FIG 1
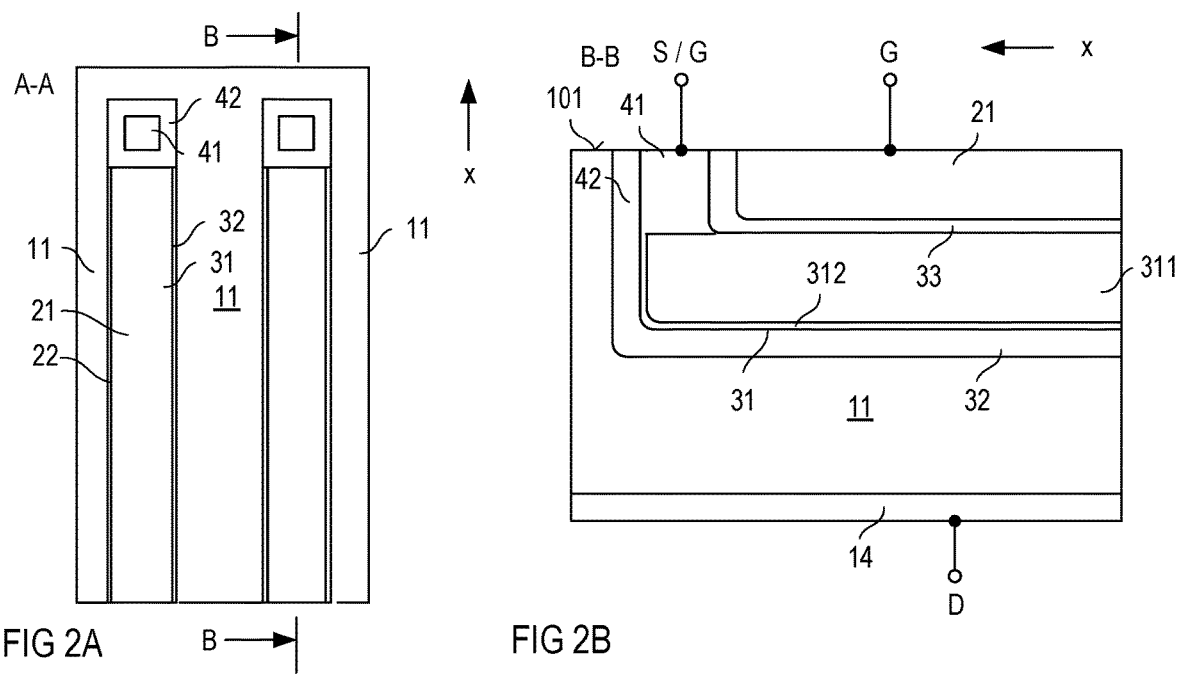
FIG 2A
FIG 2B

TRANSISTOR DEVICE WITH A FIELD ELECTRODE THAT INCLUDES TWO LAYERS

RELATED APPLICATIONS

This application is a continuation of and claims priority to U.S. application Ser. No. 16/270,806 filed 8 Feb. 2019, now U.S. Pat. No. 10,720,500 issued Jul. 21, 2020, which in turn claims priority to U.S. application Ser. No. 15/663,903 filed 31 Jul. 2017, now U.S. Pat. No. 10,243,051 issued Mar. 26, 2019, the content of said applications each being incorporated by reference in their entirety.

TECHNICAL FIELD

This disclosure in general relates to a transistor device, in particular a field-effect controlled transistor device with a field electrode.

BACKGROUND

Field-effect controlled transistor devices with insulated gate electrode are widely used as electronic switches in a plurality of different electronic applications such as automotive, industrial, household, or consumer electronic applications, to name only a few. These types of transistors are usually referred to as power MOS (Metal Oxide Semiconductor) transistors although the gate electrode (which is represented by the "M") not necessarily includes a metal and the gate dielectric (which is represented by the "O") not necessarily includes an oxide. MOS transistors include MOSFETs (Metal Oxide Field-Effect Transistors) and IGBTs (Insulated Gate Bipolar Transistors).

One specific type of power MOS transistor includes a gate electrode that controls a switching state (on or off) of the transistor, and a field electrode adjacent a drift region and dielectrically insulated from the drift region by a field electrode dielectric. The field electrode is charged when the MOS transistor switches off and discharged when the MOS transistor switches on again. The switching behaviour, that is, how fast the MOS transistor device switches off and switches on is dependent on how fast the field electrode is charged and discharged.

There is a need to provide a transistor device with a predictable switching behaviour.

SUMMARY

One example relates to a transistor device. The transistor device includes a source region, a body region, a drift region, a gate electrode, a gate dielectric, a field electrode and a field electrode dielectric. The body region is arranged between the source region and a drift region. The gate electrode is adjacent the body region and dielectrically insulated from the body region by a gate dielectric, and the field electrode is adjacent the drift region and dielectrically insulated from the drift region by a field electrode dielectric. The field electrode includes a first layer and a second layer. The first layer adjoins the field electrode dielectric. The second layer adjoins the first layer. A width direction of the field electrode is parallel to the first surface. The first layer comprises two vertical sections that extend in a vertical direction that is perpendicular to the first surface. In the width direction of the field electrode, the second layer is laterally contained between two vertical sections of the first layer.

Another example relates to a method. The method includes forming a source region, a body region and drift region in a semiconductor body such that the body region is arranged between the source region and a drift region, and forming a gate electrode adjacent the body region and dielectrically insulated from the body region by a gate dielectric. The method further includes forming a field electrode adjacent the drift region and dielectrically insulated from the drift region by a field electrode dielectric such that the field electrode includes a first layer and a second layer. The first layer adjoins the field electrode dielectric. The second layer adjoins the first layer. A width direction of the field electrode is parallel to the first surface. The first layer comprises two vertical sections that extend in a vertical direction that is perpendicular to the first surface. In the width direction of the field electrode, the second layer is laterally contained between two vertical sections of the first layer.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings, the same reference characters denote like features.

FIG. 1 shows a vertical cross-sectional view of a transistor device according to one example;

FIGS. 2A and 2B show a top view and a vertical sectional view, respectively, of a transistor device of the type shown in FIG. 1;

DETAILED DESCRIPTION

Figure 3:
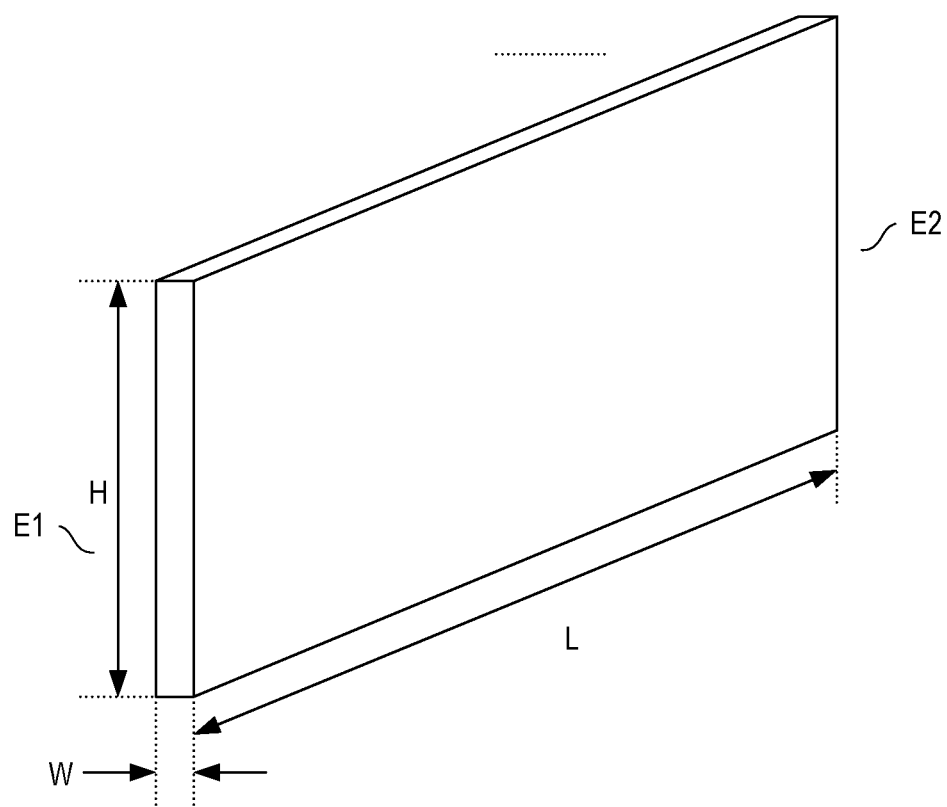
FIG. 3 schematically illustrates a layer of a conducting material, such as polysilicon.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIG. 1 shows a vertical cross-sectional view of one section of a transistor device according to one example. The transistor device includes a semiconductor body 100 with a first surface 101. FIG. 1 shows a vertical cross-sectional view of the semiconductor body 100, that is, FIG. 1 shows the semiconductor body 100 in a vertical section plane that is perpendicular to the first surface 101. According to one example, the semiconductor body 100 is a monocrystalline semiconductor body. The semiconductor body 100 may include a conventional semiconductor material such as silicon (Si), silicon carbide (SiC), or the like.

The transistor device includes at least one transistor cell and may include a plurality of transistor cells. In FIG. 1, several of these transistor cells are shown, wherein one of these transistor cells is illustrated by a dashed line and labelled with reference character 10 in FIG. 1. The at least one transistor cell 10 includes a source region 13, a body region 12 and a drift region 11, wherein the body region 12 is arranged between the source region 13 and the drift region 11 and separates the source region 13 from the drift region 11. These regions, which may also be referred to as active device regions, are doped semiconductor regions in the semiconductor body 100. A gate electrode 21 is adjacent the body region 12 and dielectrically insulated from the body region 12 by a gate dielectric 22. Furthermore, the at least one transistor cell 10 includes a field electrode 31 adjacent the drift region 11 and dielectrically insulated from the drift region 11 by a field electrode dielectric 32.

Referring to FIG. 1, the gate electrode 21 is electrically connected to a gate node G, which is only schematically illustrated in FIG. 1, and the source region 13 and the body region 12 are each electrically connected to a source node S. The source node S and electrical connections between the source node S and the source region 13 and the body region 12, respectively, are only schematically illustrated in FIG. 1. Furthermore, the transistor device may include a drain region 14 that is connected to a drain node D. The drain region 14 is arranged such that the drift region 11 is located between the body region 12 and the drain region 14. The field electrode 31 of the at least one transistor cell 10 is either connected to the source node S or to the gate node G. This connection is only schematically illustrated in FIG. 1.

If the transistor device includes a plurality of transistor cells, as shown in FIG. 1, the individual transistor cells are connected in parallel in that the gate electrodes 21 of the individual transistor cells are connected to the gate node G and that the body and source regions 12, 13 of the individual transistor cells are connected to the source node S. Referring to FIG. 1, two (neighboring) transistor cells may share one source region 13 and one body region 12 and two (other) neighboring transistor cells may share one gate electrode 21 and one field electrode 31. The drift region 11 and the drain region 14 may be shared by the plurality of transistor cells 10.

In the example shown in FIG. 1, the field electrode 31 and the gate electrode 21 of the at least one transistor cell 10 are arranged in a common trench, that will be referred to as first trench in the following. This first trench extends from the first surface 101 in a vertical direction z into the semiconductor body 100. The source region 13, the body region 12 and drift region 11 are arranged successively in the vertical direction z. In the first trench, the gate electrode 21 is closer to the first surface 101 than the field electrode 31 so that, as seen from the first surface 101, the field electrode 31 is arranged below the gate electrode 21. In the first trench, the gate electrode 21 and the field electrode 31 are dielectrically insulated from each other by a dielectric layer 33, which is referred to as intermediate dielectric in the following.

One way of how the field electrode 31, which is buried below the gate electrode 21 in the first trench in the example shown in FIG. 1, may be electrically connected to one of the source node S and the gate node G is illustrated in FIGS. 2A and 2B. FIG. 2A shows a horizontal cross-sectional view of one section of a transistor device of the type shown in FIG. 1 in a horizontal section plane A-A, and FIG. 2B shows a vertical cross-sectional view of the device shown in FIG. 2A in a section plane B-B. The horizontal section plane A-A cuts through the field electrode 31, and the vertical section plane B-B cuts through the field electrode 31 and the gate electrode 21.

FIG. 2A shows a top view of two trenches each including a gate electrode 21 and a corresponding gate dielectric 22 and a field electrode 31 and a corresponding field electrode dielectric 32, wherein the field electrode 31 and the field electrode dielectric 32 are out of view in FIG. 2A. In this example, the trenches are elongated in a first horizontal direction x of the semiconductor body 100. FIG. 2B shows a vertical cross-sectional view of one of these trenches and of a section of the drift region 11 located below the trench, that is, below the field electrode 31 and the field electrode dielectric 32. Referring to FIGS. 2A and 2B, at a longitudinal end of each first trench, the respective field electrode 31 is electrically connected to a contact electrode 41. This contact electrode 41 is arranged at a longitudinal end of the respective trench next to the gate electrode 21, which ends before the longitudinal end of the trench. Referring to FIG. 2B, the contact electrode 41 extends to the first surface 101 where it may be contacted in order to be electrically connected to either the source node S or the gate node G. The electrical connection between the contact electrode 41 and one of the source node S and the gate node G is only schematically illustrated in FIG. 2B. The contact electrode 41 is dielectrically insulated from the gate electrode 21, and from the semiconductor body 100 and the drift region 11, respectively, by another dielectric layer 42.

The transistor device can be one of an n-type transistor device and a p-type transistor device. In an n-type transistor device, the source region 13 and the drift region 11 are n-doped semiconductor regions and the body region 12 is a p-doped semiconductor region. In a p-type transistor device, the source region 13 and the drift region 11 are p-doped semiconductor regions and the body region 12 is an n-doped semiconductor region. The transistor device can be implemented as a MOSFET (Metal Oxide Semiconductor Field-Effect Transistor) or an IGBT (Insulated Gate Bipolar Transistor). In a MOSFET, the drain region 14 has the same doping type as the drift region 11, but is more highly doped than the drift region. In an IGBT, the drain region 14 (which may also be referred to as collector region) has a doping type complementary to the doping type of the drift region 11. Furthermore, the transistor device can be implemented as an enhancement device (normally-off device) or as a depletion device (normally-on device). In an enhancement device, the body region 12 adjoins the gate dielectric 22. In a depletion device, there is a channel region 15 of the same doping type as the source region 13 and the drift region 11. This channel region is arranged between the gate dielectric 22 and the body region 12 and extends from the source region 13 to the drift region 11. The optional channel region 15 is illustrated in dashed lines in FIG. 1. According to one example, doping concentrations of the individual device regions explained above are as follows, source region: between 1E18 cm$^{-3}$ and 1E21 cm$^{-3}$; body region: between 1E16 cm$^{-3}$ and 1E19 cm$^{-3}$; drift region: between 1E13 cm$^{-3}$ and 1E18 cm$^{-3}$; drain region: between 1E18 cm$^{-3}$ and 1E21 cm$^{-3}$; channel region: between 1E17 cm$^{-3}$ and 1E19 cm$^{-3}$.

The transistor device switches on or off dependent on a drive voltage (gate-source voltage) $V_{GS}$ applied between the gate node G and the source node S. The transistor device is in the on-state when the drive voltage $V_{GS}$ is such that there is a conducting channel along the gate dielectric 22 between the source region 13 and the drift region 11, and the transistor device is in the off-state when the conducting channel along the gate dielectric 22 is interrupted. An enhancement device, for example, is in the on-state if the drive voltage $V_{GS}$ is such that there is an inversion channel in the body region 12 along the gate dielectric 22. The enhancement device is in the off-state if there is no such inversion channel. A depletion device is in the off-state when the drive voltage $V_{GS}$ is such that the conducting channel 15 is depleted (interrupted), and is in the on-state when the drive voltage $V_{GS}$ does not interrupt this conducting channel 15.

Independent of whether the transistor device is an enhancement device or a depletion device a space charge region (depletion region) expands in the drift region 11 beginning at a pn-junction between the drift region 11 and the body region 12 whenever the transistor device is in the off-state and a load path voltage (drain-source voltage) $V_{DS}$ is applied between the drain node D and the source node S that reverse biases the pn-junction. In an n-type transistor device, for example, the pn-junction is reverse biased if the drain-source voltage $V_{DS}$ is a positive voltage, that is, if an electrical potential at the drain node D is higher than an electrical potential at the source node S. The depletion region expanding in the drift region 11 is associated with the ionization of dopant atoms in the drift region 11 and the ionization of dopant atoms in the body region 12. The ionized dopant atoms have a positive charge when the respective semiconductor region is n-doped and have a negative charge when the respective semiconductor region is p-doped. That is, there are positive dopant charges in the drift region 11 and negative dopant charges in the body region 11 if the drift region 11 is n-doped and the body region 12 is p-doped, respectively. Each ionized dopant atom in the drift region 11 has a counter charge of an opposite type. In the transistor device of the type shown in FIG. 1, this counter charge is either an ionized dopant atom in the body region 12 or is a respective charge in the field electrode 31. This is explained in the following.

For the purpose of explanation, it is assumed that the transistor device is an n-type transistor device and that a positive drain-source voltage $V_{DS}$ is applied between the drain node D and the source node S. By virtue of this positive drain-source voltage $V_{DS}$, the electrical potential in the drift region 11 increases towards the drain region 14. The field electrode 31 has the electrical potential of either the source node S or the gate node G, dependent on whether it is connected to the source node or the gate node. Just for the purpose of explanation it is assumed that the electrical potential of the field electrode 31 equals the electrical potential of the source node S. Thus, the electrical potential of the field electrode 31 is negative relative to the electrical potential in the drift region 11 so that the field electrode 31 provides negative counter charges to ionized dopant charges in the drift region 11. By virtue of this, the drift region 11 can be more highly doped, without reducing the voltage blocking capability of the transistor device, as compared to an equivalent transistor device that does not include a field electrode 31.

Although the electrical potential of the field electrode 31 is kept on the same level, which is the electrical potential of the source node S in the example explained above, the field electrode 31 is charged when the depletion region expands in the drift region 11, and the field electrode 31 is discharged when the transistor device again switches on so that the depletion region disappears. How fast the transistor device switches from the on-state to the off-state, and vice versa is dependent on how fast the field electrode 31 is charged when the transistor device switches off and discharged when the transistor device again switches on. In other words, even in the on-state of the transistor device there may be a depletion region in the drift region 11 as long as the field electrode 31 has not been (completely) discharged. This depletion region may increase the electrical resistance of the drift region 11 in the on-state and, therefore, may increase conduction losses of the transistor device.

How fast the field electrode 31 is charged when the transistor device switches off and how fast the field electrode 31 is discharged when the transistor device switches on is dependent on an electrical resistance between the field electrode 31 and the source or the gate node S, G, respectively. In a device topology as shown in FIG. 2, in which the field electrode 31 is connected to the contact electrode 41 at their longitudinal end and is connected to the source or gate node S, G via the contact electrode 41, the electrical resistance of the field electrode 31 itself affects the charging and discharging speed of the field electrode 31. The reason for this is that those sections of the field electrode 31 that are spaced apart from the longitudinal end are charged or discharged via sections of the field electrode 31 that are located between the longitudinal end the spaced apart regions. There may be applications where it is desirable to have a relatively low resistance in order to obtain high switching speed, or applications where it is desirable to have a relatively high resistance in order to attenuate parasitic oscillations that may occur in connection with switching on or switching off the transistor device. Nevertheless, in each of these applications it is desirable to adjust the resistance of the field electrode 31 as accurately as possible, that is, with the smallest possible spread.

In a conventional transistor device, the field electrode 31 may be comprised of highly doped polysilicon. FIG. 3 schematically illustrates one layer with a height H, a width W and a length L of highly doped polysilicon. An electrical resistance of this layer between a first longitudinal end E1 and a second longitudinal end E2 is dependent on a doping concentration of the highly doped polysilicon, the length L, the width W and the height H. If each of the width W and the height H is above a certain threshold such as about 100 nanometers (nm), the electrical resistance is substantially linearly dependent on each of the height H and the width W. If, however, one of these parameters is smaller than the threshold, non-linear effects may occur. If, for example, the width W is smaller than the threshold, such as 100 nm, variations of the electrical resistance may occur that are not linearly dependent on the width W anymore.

In a field electrode, such as the field electrode 31 shown in FIG. 1, those non-linear effects of the electrical resistance may occur if a width W of the field electrode 31 becomes smaller than a certain threshold, such as 100 nanometers. This may occur if the trench that includes the field electrode is formed to have a width smaller than the threshold. Furthermore, process variations may cause the trench to have a width smaller than the threshold. That is, a desired width of the trench may by larger than the threshold, but due to variations in the trench forming process a narrower trench may result. In order to reduce the size of the transistor device it may, however, be desirable to reduce the width w of the field electrode 31 to below say 100 nanometers. Such reduction of the width w may go along with a reduction of the pitch p. The pitch p is the distance between corresponding features in the transistor device such as, for example, a center-to-center distance of two neighboring first trenches.

In order to avoid problems outlined above and achieve a predictable switching behavior of the transistor device, the field electrode 31 includes at least two layers 311, 312 of different electrically conductive materials. In the example shown in FIG. 1, the field electrode 31 includes two layers, a first layer 311 adjoining the field electrode dielectric 31, and a second layer 312 adjoining the first layer 311. Referring to FIGS. 2A and 2B, the two layers 311, 312 extend along the longitudinal direction of the field electrode 31. According to one example, the contact electrode 41, like the field electrode 31, may include two layers (illustrated in dashed lines in FIG. 2A) of the same type as the two layers of the field electrode 31.

According to one example, the first layer 311 comprises a first material selected from a metal, a metal nitride, and a metal silicide. According to one example, the metal is one of titanium (Ti), tungsten (W), cobalt (Co) and tantalum (Ta). According to one example, the second layer 312 includes polysilicon. According to one example, a thickness d of the first layer 311 is between 5 nanometers and 50 nanometers. In the example shown in FIG. 1, an overall width w of the field electrode 31 is given by two times the thickness d of the first layer 311 plus a thickness of the second layer 312.

Unlike polysilicon, a metal, metal nitride or metal silicide layer with a thickness d of below 100 nanometers does not exhibit non-linear resistance effects so that an electrical resistance of the first material layer 311 is substantially proportional to the thickness d so that the electrical resistance of the first material layer 311 can be adjusted by suitably adjusting the thickness d of this first material layer 311. The thickness of such metal, metal nitride or metal silicide layer may even be reduced to several nanometers or even below 1 nanometer without featuring those non-linearity effects. According to one example, the first material layer 311 is produced to have a lower electrical resistance than the second material layer 312 so that the overall electrical resistance is governed by the first material layer 311. In this case, non-linear effects of the electrical resistance of the second layer 312, if they occur, do not negatively affect the switching behavior of the transistor device. Moreover, as explained in further detail below, the first material layer 311 may be produced using a deposition process in which the thickness of the first material layer 311 can be accurately controlled, so that the resistance caused by of the first material layer 311 can be accurately adjusted.

FIGS. 4A to 4G illustrate one example of a method for forming a field electrode 31 of the type shown in FIG. 1. Each of FIGS. 4A to 4G shows, during the manufacturing process, one section of the semiconductor body 100 in which one field electrode is to be formed.

Figure 4A:
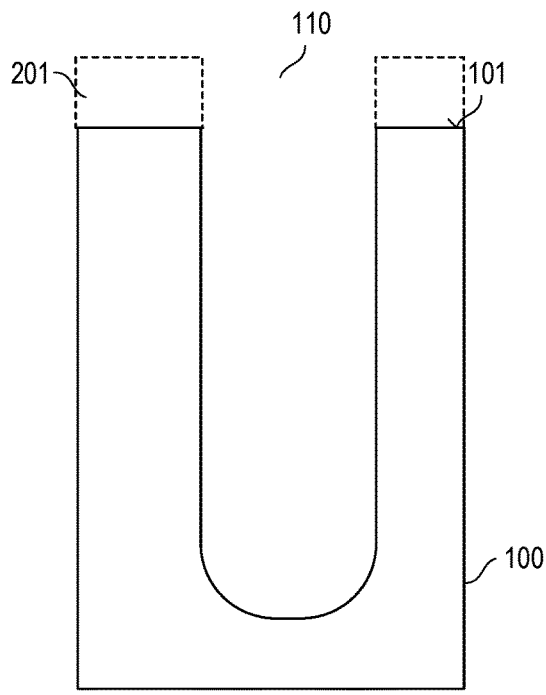
FIGS. 4A to 4G illustrate one example of a method from forming a field electrode and a field electrode dielectric of a transistor device.

Referring to FIG. 4A, the method includes forming a first trench 110 in the first surface 101 of the semiconductor body 100. Forming the first trench may include an etching process using an etch mask 201 (illustrated in dashed lines in FIG. 4A) such that the trench 110 is etched in regions of the first surface 101 uncovered by the etch mask 201.

Figure 4B:
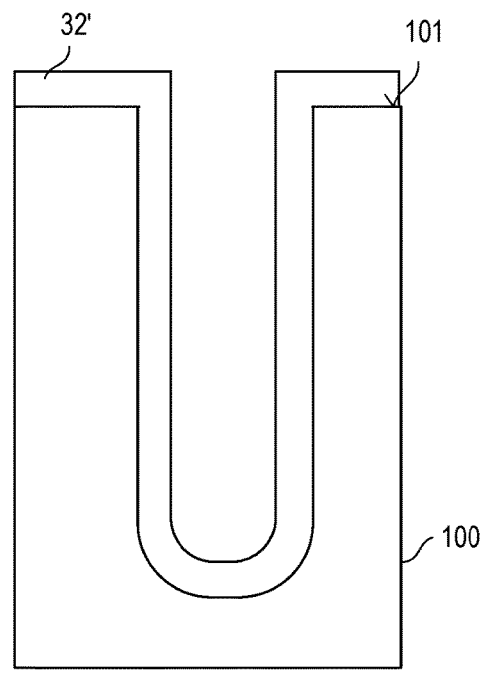

Referring to FIG. 4B, the method further includes forming a dielectric layer 32' on sidewalls and a bottom of the first trench 110. In the example shown in FIG. 4B, forming the dielectric layer 32' also includes forming the dielectric layer 32' on the first surface 110. Forming the dielectric layer 32' may include at least one of an oxidation and a deposition process. According to one example, the dielectric layer 32' includes only one type of material such as, for example, an oxide or a nitride. According to another example, the dielectric layer 32' includes a layer stack (not shown) with two or more layers of different materials.

Figure 4C:
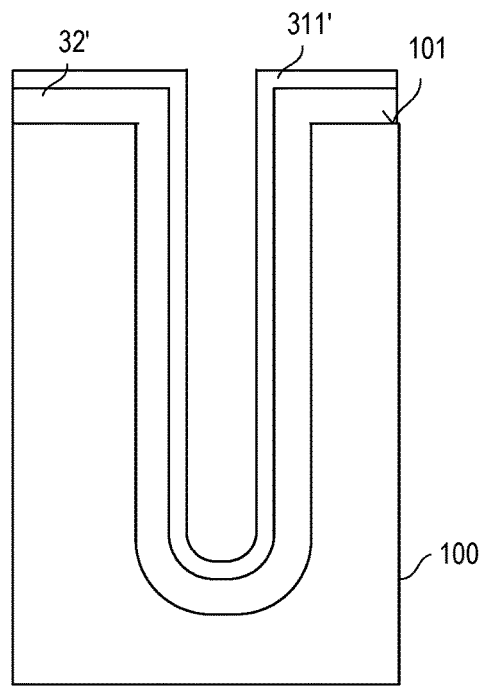

Referring to FIG. 4C, the method further includes forming a layer 311' of the first material, wherein this layer 311' forms the first material layer 311 in the finished field electrode. According to one example, forming the layer 311' includes depositing the layer 311' such that it completely covers the dielectric layer 32'. That is, in this example, the layer 311 is formed on top of the dielectric layer 32' above the bottom and the sidewalls of the first trench and above the first surface 101. Forming the layer 311' may include an ALD (Atom Layer Deposition Process). In this type of process, for example, a thickness of the layer 311' can be accurately controlled.

Figure 4D:
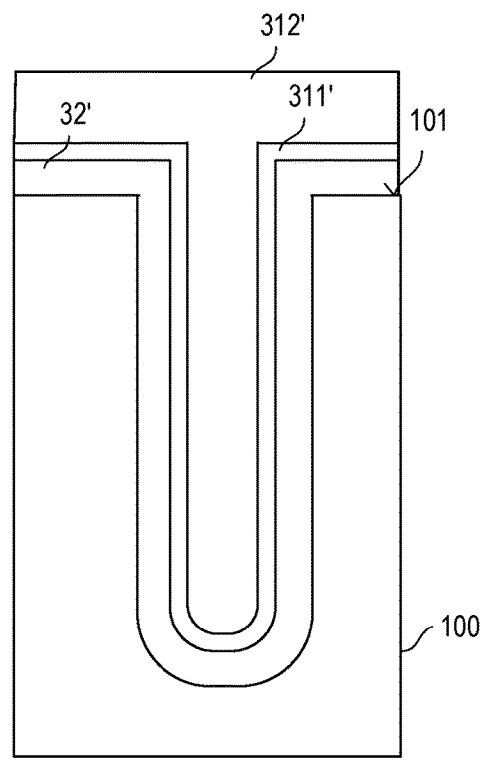

Referring to FIG. 4D, the method further includes forming a layer 312' of the second material, wherein this layer 312' forms the second material layer 312 in the finished field electrode 31. Referring to FIG. 4D, forming the layer 312' may include forming the layer 312' such that it completely covers the layer 311' and completely fills a residual trench remaining after the material layer 311' has been formed. According to one example, forming the layer 312' includes depositing the layer 312'.

Figure 4E:
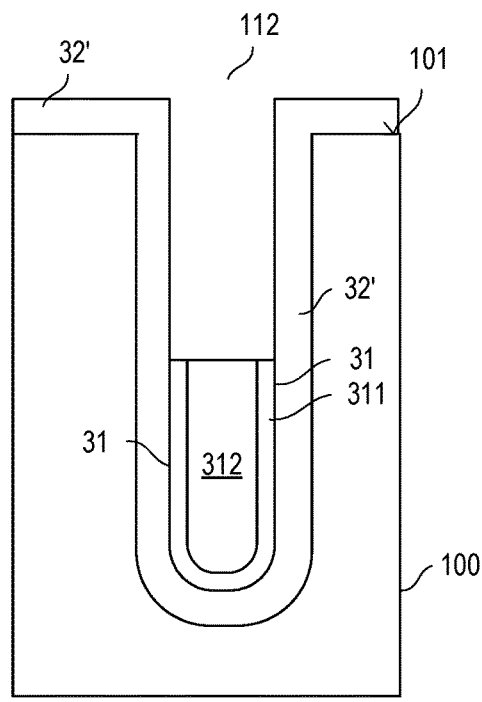

Referring to FIG. 4E, the method further includes etching back layers 311' and 312', so as to form the first and second layers 311, 312 of the field electrode 31. According to one example, etching back layers 311', 312' includes etching the layers 311', 312' using an etchant so that a trench 112 formed above the field electrode 31 and the field electrode 31 has a desired size. Layers 311' and 312' may be etched together in one etching process, such as a dry etch process. According to another example, these layers 311', 312' are etched separately. The second layer 312' may be etched in a first process, and the first layer 311' may be etched in a second process. The first process is a dry etching process and the second process is a selective wet etching process, for example.

Figure 4F:
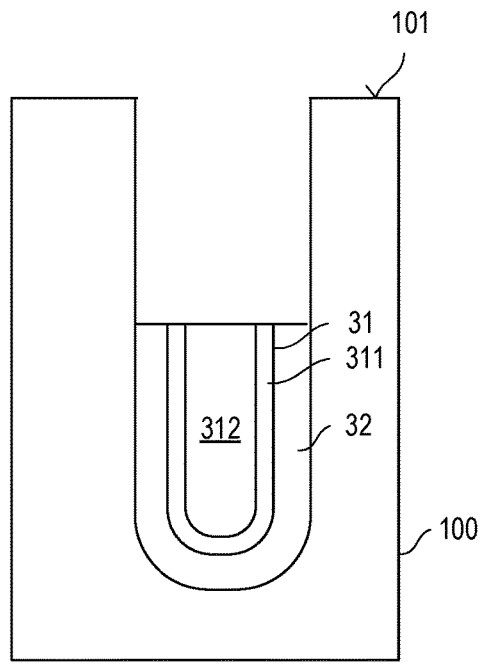

Referring to FIG. 4F, the method further includes etching the dielectric layer 32' down to the field electrode 31 so as to form the field electrode dielectric 32. According to one example, the dielectric layer 32' includes an oxide and an etchant used to etch the dielectric layer include hydrofluoric (HF) acid.

Figure 4G:
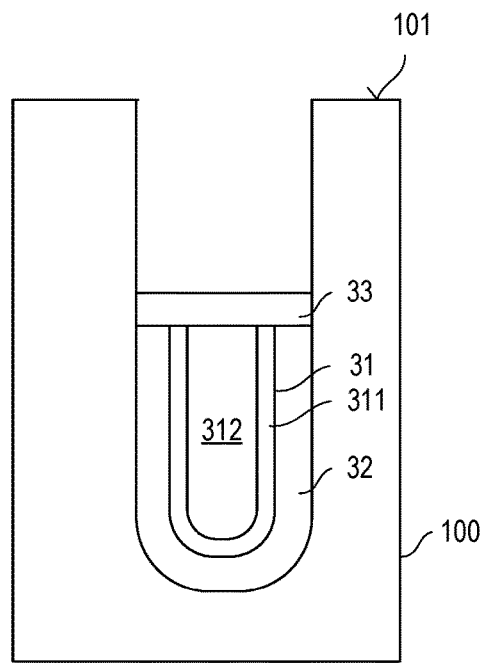

Referring to FIG. 4G, the method further includes forming the intermediate dielectric layer 33 that separates the field electrode 31 from the gate electrode 22. Forming the intermediate dielectric layer 33 may include a HDP (High Density Plasma) deposition process. The intermediate dielectric layer 33 may include the same type of material as the dielectric layer 32' or a different type of material. According to one example, the intermediate dielectric layer 33 includes an oxide.

Furthermore, the method includes forming the gate dielectric 22 and the gate electrode 21 above the intermediate dielectric layer 33 so as to obtain a topology as shown in FIG. 1. Forming the gate dielectric layer include an oxidation process and forming the gate electrode 21 may include a deposition process that fills a residual trench remaining after forming the gate dielectric 22. The semiconductor body 100 shown in FIGS. 4A to 4G may have a basic doping that corresponds to the doping of the drift region 11 in the device shown in FIG. 1. The source region 13, and the body region 12 may be formed by implanting and/or diffusing dopants via the first surface 101 into the semiconductor body 100. The drain region 14 may be formed by implanting and/or diffusing dopants via a second surface opposite the first surface 101 into the semiconductor body 100. Alternatively, the semiconductor body includes a semiconductor substrate with a doping that equals a desired doping of the drain region and an epitaxial layer on top of the substrate with a basic doping that equals a desired doping of the drift region 11. In this case, the substrate forms the drain region 14, and in the epitaxial layer the gate and field electrodes 21, 31 and the respective dielectric layers 22, 32, 33, the source regions 13 and the body regions 12 are formed, and remaining sections of the epitaxial layer form the drift region 11.

Figure 5:
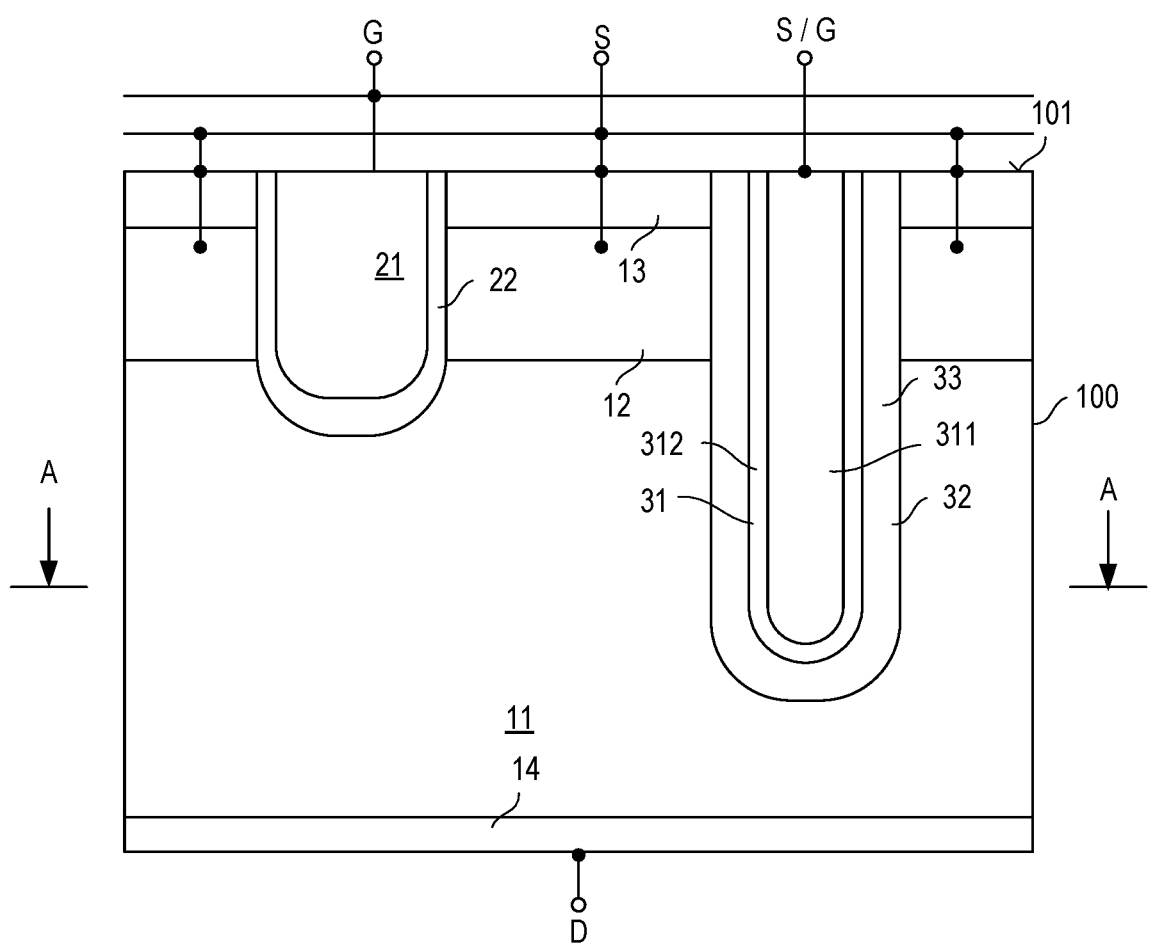
FIG. 5 shows a vertical cross-sectional view of a transistor device according to another example.

FIG. 5 shows a vertical cross-sectional view of the transistor device according to another example. In this example, the field electrode 31 and the gate electrode 21 are not located in the same trench. Instead, the gate electrode 21 is located in a second trench spaced apart from first trench with the field electrode 31 in a second lateral direction y.

Figure 6:
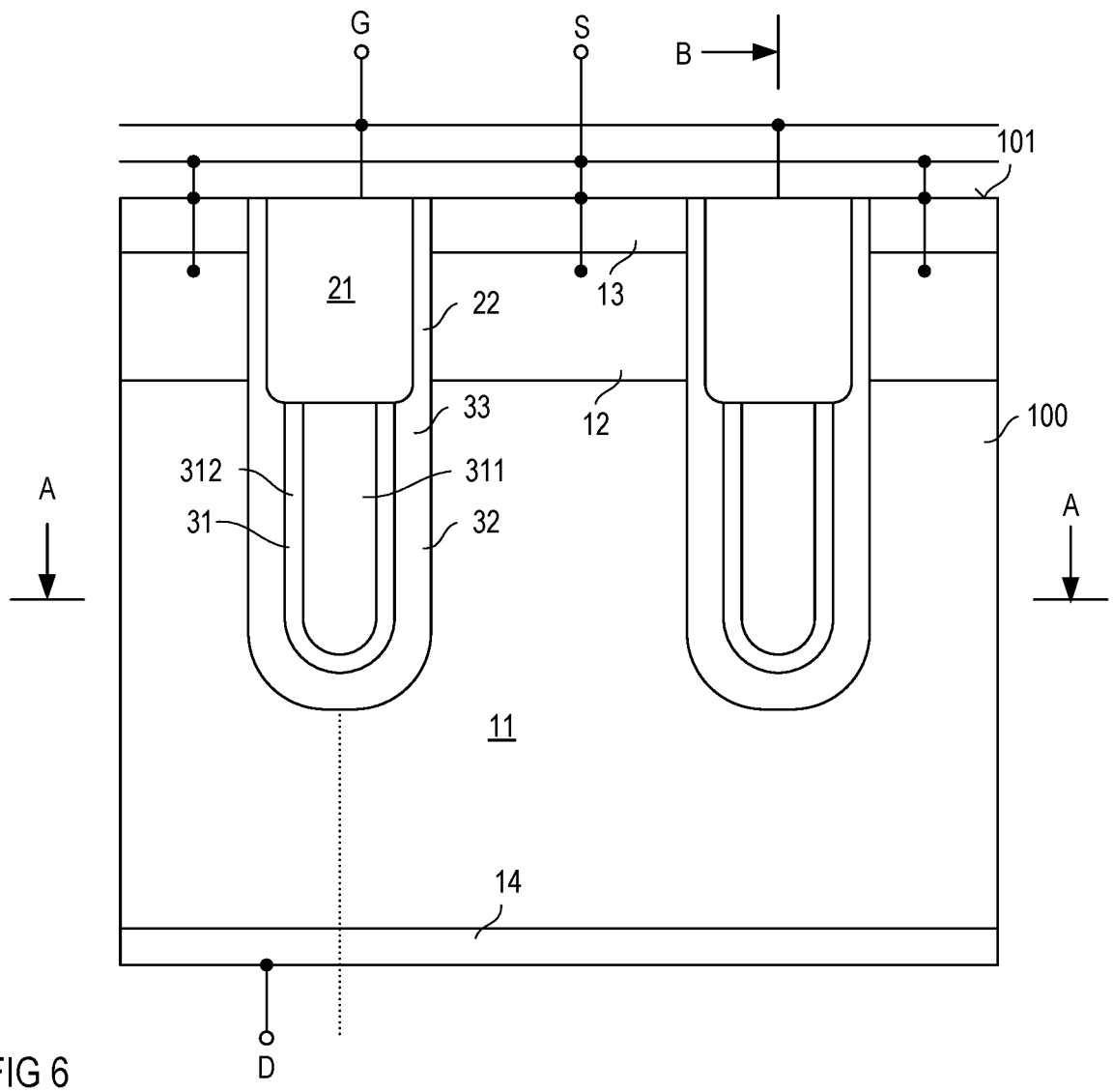
FIG. 6 shows a vertical cross-sectional view of a transistor device according to another example.

According to yet another example, shown in FIG. 6, the field electrode 31 and the gate electrode 21 are located in the same trench, and the gate electrode 21 is electrically connected to the field electrode 31 in the first trench. In this case, the field electrode 31 is electrically connected to the gate node via the gate electrode 21.

Figure 7:
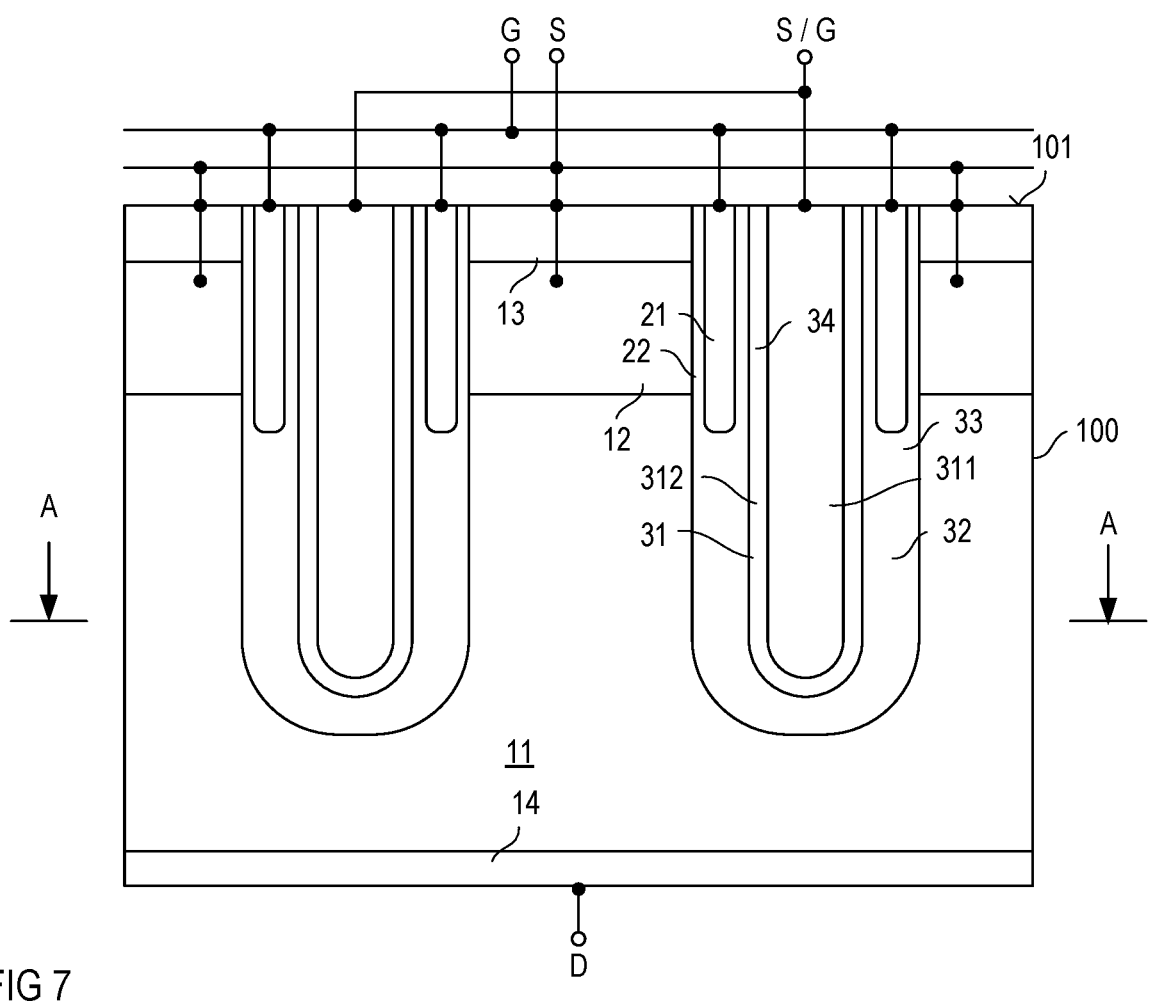
FIG. 7 shows a vertical cross-sectional view of a transistor device according to yet another example.

FIG. 7 shows a modification of the transistor device shown in FIG. 6. In this transistor device, the gate electrode 21 and the field electrode 31 of one transistor cell are arranged in the same trench. The field electrode 31 extends to the first surface 101 so that there are sections where the gate electrode 21 is spaced apart from the field electrode 31 in a lateral direction. The gate electrode 21 is dielectrically insulated from the field electrode 31 by a dielectric layer 34 in these sections.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a source region, a body region and a drift region in a semiconductor body such that the body region is arranged between the source region and the drift region;
   forming a gate electrode adjacent the body region and dielectrically insulated from the body region by a gate dielectric; and
   forming a field electrode adjacent the drift region and dielectrically insulated from the drift region by a field electrode dielectric such that the field electrode includes at least two layers,
   wherein the at least two layers comprise a first layer and a second layer,
   wherein the second layer comprises a different conductive material as the first layer, and
   wherein a portion of the second layer is disposed above and directly contacts a portion of the first layer.

2. The method of claim 1, wherein the first layer has a lower electrical resistance than the second layer.

3. The method of claim 1, wherein forming the field electrode comprises:
   forming a first trench in a first surface of the semiconductor body;
   forming the first layer in the first trench; and
   forming the second layer in the first trench directly on the first layer.

4. The method of claim 3, further comprising:
   etching back the first layer and the second layer to form a third residual trench between the first layer and the second layer and the first surface.

5. The method of claim 4, further comprising:
   forming the gate electrode and the gate electrode dielectric in the first trench between the field electrode and the first surface.

6. The method of claim 1, wherein the conductive material of the first layer is selected from the group consisting of: a metal; a metal nitride; and a metal silicide.

7. The method of claim 6, wherein the conductive material of the first layer is selected from the group consisting of: titanium (Ti); tungsten (W); cobalt (Co); and tantalum (Ta).

8. The method of claim 6, wherein the conductive material of the second layer is polysilicon.

9. A transistor device, comprising:
   a semiconductor body comprising a first surface;
   a gate electrode disposed in a trench in the semiconductor body and dielectrically insulated from the semiconductor body by a gate dielectric; and
   a field electrode disposed in the trench that comprises the gate electrode or in a separate trench in the semiconductor body, the field electrode dielectrically insulated from the semiconductor body by a field electrode dielectric,
   wherein the field electrode comprises a first layer and a second layer,
   wherein the second layer comprises a different conductive material as the first layer, and
   wherein a portion of the second layer is disposed above and directly contacts a portion of the first layer.

10. A transistor device, comprising:
    a semiconductor body comprising a first surface;
    a source region;
    a drift region;
    a body region being arranged between the source region and the drift region;
    a gate electrode adjacent the body region and dielectrically insulated from the body region by a gate dielectric; and
    a field electrode adjacent the drift region and dielectrically insulated from the drift region by a field electrode dielectric,
    wherein the field electrode comprises a first layer and a second layer,
    wherein the second layer comprises a different conductive material as the first layer, and
    wherein a portion of the second layer is disposed above and directly contacts a portion of the first layer.

11. The transistor device of claim 10, wherein the first layer has a lower electrical resistance than the second layer.

12. The transistor device of claim 10, wherein a width of the field electrode is smaller than 100 nanometers.

13. The transistor device of claim 10, wherein the conductive material of the first layer is selected from the group consisting of: a metal; a metal nitride; and a metal silicide.

14. The transistor device of claim 13, wherein the conductive material of the first layer is selected from the group consisting of: titanium (Ti); tungsten (W); cobalt (Co); and tantalum (Ta).

15. The transistor device of claim 13, wherein the conductive material of the second layer is polysilicon.

16. The transistor device of claim 10, wherein the field electrode and the field electrode dielectric are arranged in a first trench of a semiconductor body.

17. The transistor device of claim 16, wherein the gate electrode and the gate dielectric are arranged in a second trench spaced apart from the first trench.

18. The transistor device of claim 16, wherein the gate electrode and the gate dielectric are arranged in the first trench above the field electrode.

19. The transistor device of claim 18, wherein the gate electrode is dielectrically insulated from the field electrode in the first trench.

20. The transistor device of claim 18, wherein the gate electrode is electrically connected to the field electrode in the first trench.

* * * * *